United States Patent [19]

Goto et al.

[11] Patent Number: 4,809,289

[45] Date of Patent: Feb. 28, 1989

[54] SEMICONDUCTOR LASER DEVICE

[75] Inventors: Katsuhiko Goto; Hirofumi Namizaki, both of Itami, Japan

[73] Assignee: Mitsubishi Denki Kabushiki Kaisha, Tokyo, Japan

[21] Appl. No.: 55,506

[22] Filed: May 29, 1987

[30] Foreign Application Priority Data

May 30, 1986 [JP] Japan .................................. 61-126175

[51] Int. Cl.$^4$ ................................................. H01S 3/19
[52] U.S. Cl. ......................................... 372/46; 372/44; 372/45
[58] Field of Search ..................................... 372/43–47

[56] References Cited

FOREIGN PATENT DOCUMENTS 0235491 11/1985 Japan ...................................... 372/46

OTHER PUBLICATIONS

Applied Phys. Lett., vol. 47, No. 12, (Dec. 5, 1985), "Low Threshold Planar Buried Heterostructure Lasers Fabricated by Impurity-Induced Disordering", by R. L. Thornton et al.

Applied Phys. Lett., vol. 45, No. 1, (Jul. 1, 1984), "GaAlAs Buried Multi-Quantum Well Lasers Fabricated by Diffusion-Induced Disordering", by Tadashi Fukuzawa et al.

Primary Examiner—William L. Sikes
Assistant Examiner—Georgia Y. Epps
Attorney, Agent, or Firm—Oblon, Fisher, Spivak, McClelland & Maier

[57] ABSTRACT

A semiconductor laser device comprises a semi-insulating substrate and at least two kinds of the thin compound semiconductor layers having different width of band gap, which are alternately superimposed on the seim-insulating substrate to form a multiquantum well layer, wherein disordered regions are formed in the multiquantum well layer except for a stripe region having a narrow width at its intermediate portion by selectively diffusing two kinds of impurities having different conductive properties from both sides of the multiquantum well layer until the impurities reach the semi-insulating substrate.

4 Claims, 1 Drawing Sheet

SEMICONDUCTOR LASER DEVICE

BACKGROUND OF THE INVENTION

1. FIELD OF THE INVENTION

The present invention relates to a semiconductor laser device More particularly, it relates to an improved structure of a semiconductor laser device capable of starting a transverse fundamental mode by a low threshold current and making its manufacture feasible.

2. DISCUSSION OF BACKGROUND

FIG. 2 is a diagram showing a conventional planer stripe type laser device formed by using an impurity diffusion method as a semiconductor laser device of this kind.

The conventional planer stripe type semiconductor laser device having the construction as in FIG. 2 is fablicated as follows. On an n-GaAs substrate 11, an n-AlGaAs layer 12, a GaAs layer 13, a p-AlGaAs layer 14 and an n-GaAs layer 15 are respectively formed by using a growth technique; by selectively diffusing Zn in a stripe form having the width about 10 μm from the uppermost n-GaAs layer 15 until Zn reach the p-AlGaAs layer 14 to form a Zn diffused p-region 16 indicated by hatched lines to thereby reversing the n-GaAs layer 15 into a p-type conducting layer, and by forming a p-side electrode 17 on the n-GaAs layer 15 while an n-side electrode 18 is formed on the n-GaAs substrate 11.

In the conventional semiconductor laser device, when a forward biasing voltage is applied to it, the region of the p-AlGaAs layer 14 and the n-GaAs layer 15 except for the Zn diffused p-region 16 is reversely biased, whereby a current is concentrated to the Zn diffused p-region 16. As a result, the density of injection of carriers becomes large at a portion in the GaAs layer 13 just below the Zn diffused p-region 16 and there takes place a laser beam and at the same time, a high gain is obtainable at that portion just below the Zn diffused p-region 16 with the result that amplification of lightwaves occurs due to stimulated emission; thus, the portion just below the Zn diffused p-region 16 constitutes a waveguide region.

As described above, the conventional planer stripe type semiconductor laser device is so constructed that a current is restricted by a p-n reverse bias junction. In this case, it is difficult to reduce a threshold current since the current spreads from the Zn diffused p-region 16 to the p-AlGaAs layer 14. In addition, horizontal transverse mode of emission is apt to be unstable because the conventional semiconductor laser device is of a gain waveguide type wherein a refractive index waveguide path is not formed.

SUMMARY OF THE INVENTION

It is an object of the present invention to provide a semiconductor laser device capable of starting a transverse fundamental mode of emission by a low threshold current.

It is another object of the present invention to provide a semiconductor laser device having a simple structure without a complicated manufacturing steps such as forming a mesa stripe, a buried stripe and so on.

The foregoing and the other objects of the present invention have been attained by providing a semiconductor laser device which comprises a semi-insulating substrate and at least two kinds of the thin compound semiconductor layers having different width of band gap, which are alternately superimposed on the semi-insulting substrate to form a multiquantum well layer, wherein disordered regions are formed in the multiquantum well layer except for a stripe region having a narrow width at its intermediate portion by selectively diffusing two kinds of impurities having different conductive properties from both sides of the multiquantum well layer until the impurities reach the semi-insulting substrate.

BRIEF DESCRIPTION OF THE DRAWINGS

A more complete appreciation of the invention and may of the attendant advantages thereof will be readily obtained as the same becomes better understood by reference to the following detailed description when considered in connection with the accompanying drawings, wherein.

DETAILED DESCRIPTION OF PREFERRED EMBODIMENTS

In the semiconductor laser device of the present invention, a semi-insulating substrate is used; a semiconductor wafer having a double heterostructure including a active layer of a multiquantum well is formed on the semi-insulating substrate; and a stripe region having a narrow width is formed in the active layer by selectively diffusing a p-type impurity and an n-type impurity in the semiconductor wafer remaining the stripe region, whereby the portion except for the stripe region of the active layer in the multiquantum well structure is disordered by the impurity diffusion.

In the following, an embodiment of the semiconductor laser device of the present invention will be described in detail with reference to FIG. 1.

Figure 1:
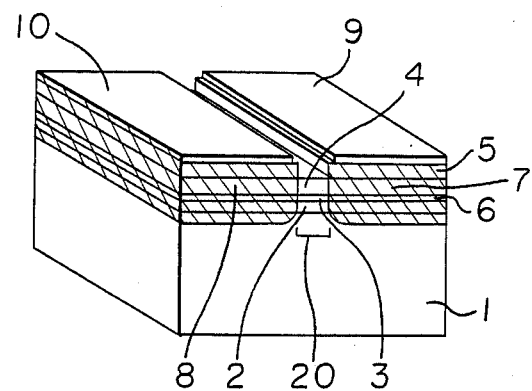
FIG. 1 is a perspective view showing an embodiment of the semiconductor laser device according to the present invention and, FIG. 2 is a perspective view showing a conventional semicoñductor laser device.
Figure 2:
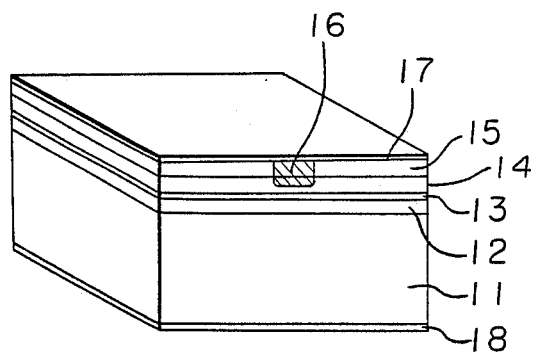

In FIG. 1, on a Cr-doped semi-insulating GaAs substrate 1, an $Al_xGa_{1-x}As$ layer 2, an $Al_xGa_{1-x}As$/GaAs multiquantum well layer 3, an $Al_xGa_{1-x}As$ layer 4 and a GaAs layer 5 are successively formed by a growth technique in this order. A p-type region 7 is formed by selectively diffusing Zn on one side of the laminated layer until the p-type region 7 reaches the semi-insulating substrate 1, and an n-type region 8 is formed by selectively diffusing Si on the other side of the laminated layer until the n-type region reaches the semi-insulating substrate 1 while remaining a stripe having a width of about 1 μm to 5 μm at the intermidiate portion of the laminated layer. The width is preferably determined to be about 2 μm.

The p-type region 7 and the n-type region 8 are respectively shown by hatched lines. Accordingly, an AlGaAs layer 6 having averaged composition is formed in the hatched portion of the AlGaAs/GaAs multiquantum well layer 3 by disordering the well layer 3 by the diffusion of Zn or Si. A p-type electrode 9 is attached on the Zn diffused p-region 7 and an n-type electrode 10 is attached on the Si diffused n-region 8 respectively.

In the semiconductor laser device having the above-mentioned structure, since the width of the band gap of the GaAs layer is narrower than that of the AlGaAs layer, the diffusion potential of the GaAs p-n junction is lower than that of the AlGaAs p-n junction, and the resistance of the Cr-doped GaAs substrate 1 is very high as $10^6$ Ωcm, there is no current conduction in the substrate 1. Accordingly, a current flows in the transverse direction from the p-type region 7 to the n-type region 8 so that it concentrates to the GaAs layer in the AlGaAs/GaAs multiquantum well layer as the result of producing of the laser emmision. At this moment, the AlGaAs layer 6 having the disordered average composition functions as a barrier layer to the injected carriers to thereby confine the carriers. Since the refractive index of the multiquantum well layer 3 is greater than any of the refractive index of the AlGaAs layer 6 having the averaged composition, there is easily obtainable refractive index difference of about $10^{-2}$ by providing the above-mentioned structure. The multiquantum well layer 3 in the stripe region as the active region is formed between the AlGaAs layer 6 having a low refractive index and the averaged composition, whereby the horizontal transverse mode of emission can be easily controlled by such refractive index difference.

In the embodiment described above, the laser device is constituted by using the AlGaAs/GaAs series material. However, another material such as an InGaAsP/InP series material may be used.

The semiconductor layer device of the present invention is as constructed that a current flows in the transverse direction in several thin film layers grown in a multi-layer on the semi-insulating substrate. Accordingly, a leak current can be minimized and emission of laser can be obtained by low threshold current. Further, since the multiquantum well layer constitutes a active layer, and the active layer which is disordered except for the stripe region having a narrow width at the intermediate portion is formed by selectively diffusion impurites having difference conductive properties from the both sides of the active layer, a refractive index waveguide path is formed due to refractive index difference between the stripe-shaped multiquantum well layer and disordered portions, whereby a stable horizontal transverse mode of emision can be obtained.

What is claimed is:

1. A semiconductor laser device which comprises:
   (a) a semi-insulating Cr-doped GaAs substrate; and
   (b) on said substrate in order the following laminated layers:
   (i) an $Al_xGa_{1-x}As$ layer,
   (ii) an $Al_xGa_{1-x}As$/GaAs multiquantum well layer,
   (iii) an $Al_xGa_{1-x}As$ layer, and
   (iv) a GaAs layer; and thereon
   (c) a p-region and an n-region, respectively, formed at both sides of said laminated layers, whereby disordered regions are formed in said multiquantum well layer except for a stripe region as an intermediate portion by selectively diffusing two kinds of impurities having different conductive properties from both sides of said multiquantum well layer until said impurities reach said semi-insulating substrate.

2. The semiconductor laser device according to claim 1, wherein the width of said stripe region is ranging from 1 μm to 5 μm.

3. The semiconductor laser device according to claim 2, wherein a p-type electrode is provided on an Zn-diffused p-region and an n-type electrode is provided on an Si-diffused n-region.

4. A semiconductor laser device, which comprises a semi-insulating substrate, and a laminated layer on said semi-insulating substrate which consists of a multiquantum well active layer, formed by alternately laminating two kinds of compound semiconductor layers having a different width of band gap and cladding layers, which are formed on both sides of said active layer, wherein disordered regions are formed in said multiquantum well active layer, except for a stripe region at an intermediate portion thereof by selectively diffusing two kinds of impurities having different conductive properties from both sides of said multiquantum well active layer until the impurities reach said semi-insulating substrate, and wherein electrodes are formed on said impurity diffusion regions having different conductive properties.

* * * * *